United States Patent [19]

Pethig et al.

[11] Patent Number: 5,302,898
[45] Date of Patent: Apr. 12, 1994

[54] ELECTRON SPIN RESONANCE SPECTROMETERS

[75] Inventors: Ronald Pethig; Myles H. Capstick, both of Gwynedd, Great Britain; Peter R. C. Gascoyne, Bellaire, Tex.

[73] Assignee: Gyros Technology Limited, United Kingdom

[21] Appl. No.: 834,225
[22] PCT Filed: Aug. 17, 1990
[86] PCT No.: PCT/GB90/01300
§ 371 Date: Apr. 16, 1992
§ 102(e) Date: Apr. 16, 1992
[87] PCT Pub. No.: WO91/02967
PCT Pub. Date: Mar. 7, 1991

[30] Foreign Application Priority Data

Aug. 17, 1989 [GB] United Kingdom ............... 8918802

[51] Int. Cl.⁵ ............................................. G01R 33/08
[52] U.S. Cl. ........................................ 324/316; 324/300
[58] Field of Search ............... 324/316, 318, 300, 322

[56] References Cited

U.S. PATENT DOCUMENTS

4,455,527 6/1984 Singer ................................. 324/316
5,142,232 8/1992 Konishi et al. ..................... 324/316

Primary Examiner—Louis Arana
Attorney, Agent, or Firm—Breiner & Breiner

[57] ABSTRACT

Electron spin resonance spectrometers comprise a sample cavity located between the poles of a permanent magnet, means for applying microwave energy to the cavity, means for measuring the frequency of the microwave energy applied to the cavity, means for controlling the magnetic field strength in the cavity, means for detecting changes in cavity Q and accordingly changes in the level of microwave power reflected back from the cavity, and means for analyzing the changes in reflected power. In accordance with one aspect, a nuclear magnetic resonance probe including a standard sample is placed adjacent the sample cavity, means are provided for measuring the nuclear magnetic resonance frequency in the standard sample, calculating the magnetic field to which the sample and the adjacent cavity are subjected therefrom and applying the results of the calculation to control the magnetic field strength in the cavity. In another aspect the spectrometer includes control means for controlling the operation of the spectrometer by stabilizing the precisely defined relationship between magnetic field strength and microwave frequency at resonance in accordance with a fixed or swept demand g-value relating to the test sample.

7 Claims, 9 Drawing Sheets

ELECTRON SPIN RESONANCE SPECTROMETERS

This invention relates to electron spin resonance spectrometers.

Electron spin resonance (ESR) effects are associated with the presence of unpaired electrons, referred to as free radicals, in solids, liquids and gases. Free radicals often occur as transient intermediates during chemical and biochemical interactions, and are chemical species having a characteristic magnetism which can be most sensitively detected by electron spin resonance spectroscopy. This technique involves aligning the magnetism of the free radicals in a strong magnetic field and then observing their resonant interaction with microwave energy. The conditions under which resonance occurs and the intensity of the resonance allow characterisation and quantification of radical species within a test sample.

In addition, a number of synthetic chemical agents have been developed that are stable free radicals or that are capable of reacting under specific conditions to form stable free radicals. The study of naturally occurring free radicals allows insights to be gained into reaction mechanisms and kinetics, and synthetic agents have allowed the scope of such studies to be broadened to include previously inaccessible areas of chemistry, biology and biophysics. Electron spin resonance measurements are now widely applied in chemical, biochemical and biophysical sciences, and their usefulness has gained wide acceptance in toxicology, pharmacology and in various chemical industries.

Electron spin resonance (ESR) spectroscopy techniques have been used for over twenty years to detect free radicals characteristic of a particular substance. In a basic electron spin spectrometer, a magnet is used to align the free radicals of a test sample. A source of microwaves is made to interact with these aligned radicals and control systems are used to control accurately the magnetic field and the microwave frequency applied to the test sample so that the free radical resonance condition of the test sample can be observed.

According to theory, the electron spin resonance (ESR) condition occurs when the microwave frequency and magnetic field strength bear a precise relationship to one another. Specifically, if H is the magnetic field strength and f is the microwave frequency then resonance occurs when the following relationship is obeyed:

$$g = k(f/H)$$

where the constant k is given by the quotient of Planck's constant, h, and the Bohr magneton B (i.e. h/B). The factor g (which will be referred as the "g-value") is a characteristic of the free radical species under investigation. It follows that for resonance to occur, the quotient f/H must have the specific value which is characteristic of the radical species under investigation.

Since the resonance frequency of a microwave cavity critically depends on its geometry (and is temperature sensitive), and on the dielectric properties of the sample (which may vary during an experiment), it is not feasible in practical electron spin resonance (ESR) spectrometers to maintain a constant microwave frequency. Because the microwave frequency will vary, it follows that the magnetic field strength needed to maintain the g-value corresponding to the free radical resonant condition must be varied in order to keep the quotient f/H constant.

Some commercial ESR spectrometers are equipped with field/frequency locking devices. In these devices, an independent (ESR) probe is mounted next to the sample cavity. This second probe contains a standard free radical sample and the electronics controlling the probe adjusts the magnetic field strength until the standard sample resonates. This locks the entire ESR spectrometer to the g-value of the standard sample. By providing additional current-carrying pancake coils around the probe, the local magnetic field experienced by the probe sample can be made to deviate from that experienced by the test sample in the microwave cavity. In order to keep the probe in resonance, the magnetic field controller has to compensate for the magnetic field experienced by the probe by an amount equal to the offset generated by the current flow of the pancake coils. Thus the g-value in the sample cavity can be varied with respect to the g-value of the standard in the probe by altering the current through the coil windings.

This approach to locking the g-value of the spectrometer has the disadvantage that the g-value can only be offset by a relatively small amount from that of the standard because of practical limitations on the amount of current which the windings can carry in developing g-value offsets. Furthermore, the magnetic field has to be disturbed by the probe in order to give a g-value offset between the experimental and standard samples and this disturbance perturbs the homogeneity of the magnetic field experienced by the sample under investigation. This limits the resolution of the spectrometer and requires that the probe and sample cavity be mounted as far apart as possible. This in turn calls for as large a magnetic pole piece size as possible, increasing the size, weight, power consumption and cooling requirements of the ESR magnet.

Despite the widespread usefulness of electron spin resonance studies, the enormous potential of this technique for use in routine screening in industry and hospital laboratories has not been realised. This failure results from the high cost of current commercial apparatus and because current equipment can only be operated by highly trained specialists. Furthermore, such apparatus is not portable and tends to be bulky. These factors have resulted in the ESR techniques remaining largely an exotic tool of research laboratories and those industrial settings where the high costs of equipment can be justified, and where space is relatively not important.

U.S. Pat. No. 3,691,453 discloses a compact microwave ESR spectrometer in which a d.c. magnetic field is applied to a test sample in a sample cavity, and the resonant absorption of the sample is observed as the magnitude of the magnetic field is varied by small amounts relative to the large d.c. field. The resonant absorption is observed using a microwave detector in a detector cavity which monitors the magnitude of the microwave field in the sample cavity. The sample cavity and detector cavity are connected so that the microwave field is coupled to the detector.

U.S. Pat. No. 4,048,555 discloses a ESR spectrometer which has a similar cavity arrangement to that disclosed in U.S. Pat. No. 3,691,453, but includes a magnet structure which enables the ESR spectrometer to be both compact and portable.

However, the spectrometers disclosed in U.S. Pat. Nos. 3,691,453 and 4,048,555 although being compact and portable still require substantial expertise in the ESR field in order to use them and are limited in the types of samples that can be investigated.

In the case of the spectrometer disclosed in U.S. Pat. No. 3,582,778 the sample holder will have to be repositioned before measurement of a new sample, a process that will be very critical if sensitivity is not to be massively degraded. The optimum positioning of the sample will vary greatly with the operating microwave frequency, which is in turn a function of the sample conductivity. The optimum positioning varies due to the inherent asymmetry in a cavity that also houses the microwave source which makes it impractical to consider more than one type of sample or sample holder. The spectrometers disclosed in U.S. Pat. Nos. 4,360,776 and 3,691,453 also have inherent asymmetry that will limit the types of sample. Also, in the spectrometers disclosed in U.S. Pat. No. 3,691,453 the test sample is required to be attached to the microwave cavity wall, which in turn limits measurements to be made on solid samples only.

It has been found that by utilising state-of-the-art electronics and computer technology, a small compact and lightweight electron spin resonance spectrometer can be produced at a greatly reduced cost. Such a spectrometer may have simplified operation and automatic interpretation of data, enabling a technician to perform routine electron spin resonance analysis without recourse to a specialist in the field.

According to a first feature of the present invention there is provided an electron spin resonance spectrometer comprising a sample cavity located between the poles of a permanent magnet, means for applying microwave energy to the cavity at the same frequency as the cavity resonance, means for measuring the frequency of the microwave energy applied to the cavity, means for controlling the magnetic field strength in the cavity, means for detecting changes in cavity Q and accordingly changes in the level of microwave power reflected back from the cavity, and means for analysing the changes in reflected power, and characterised by including adjacent the sample cavity, a nuclear magnetic resonance probe including a standard sample and by providing means for measuring the nuclear magnetic resonance frequency in the standard sample, calculating the magnetic field to which the sample and the adjacent cavity are subjected therefrom and applying the results of the calculation of the ratio of magnetic field and microwave frequency to control the magnetic field strength in the cavity to maintain a desired g-value relating to the test sample.

According to a further aspect of the present invention, there is provided an electron spin resonance spectrometer comprising a sample cavity in which a test sample can be placed, means for applying a magnetic field to the test sample, means for subjecting the test sample to microwave energy at the same frequency as the cavity resonance, means for measuring the magnetic field strength and microwave frequency, means for detecting resonance of the test sample and for producing output signals in accordance with resonance, and characterised by control means for controlling the operation of the spectrometer by stabilishing, by the control of the magnetic filed, the precisely defined ratio between magnetic field strength and microwave frequency at resonance in accordance with a fixed or swept demand g-value relating to the test sample.

According to a yet further aspect of the invention, there is provided a method of operating an ESR spectrometer which comprises subjecting a sample cavity located between the poles of a magnet to microwave energy, measuring the microwave power reflected back from the sample cavity and processing and monitoring the reflected power to maintain the microwave energy at the same frequency as the cavity resonance, wherein the static magnetic field in the sample cavity is controlled by the application of an additional magnetic field thereto by an external electro-magnet characterised in that the applied magnetic field is controlled by continuously measuring the magnetic field strength, and varying the magnetic field strength in order to maintain the ratio between it and the microwave frequency, the g-value, constant under the control of a pre-programmed microprocessor.

The constant or demand g-value in question will depend on the particular sample under investigation and in particular on the free radical species it is desired to investigate. The operation of the ESR spectrometer is preferably controlled by a microprocessor which is adapted to have input a desired g-value and which then controls the magnetic filed in dependence on the desired g-value and the actual microwave frequency automatically under the control of an appropriate programme. The operator does not need to know the actual value either of the magnetic field or of the microwave frequency. The latter will vary with changes in temperature and sample and the former will be varied under process control to maintain the g-value at the desired value.

This method of control, which gives very substantial simplification of operation in use, is of great value in compact ESR spectrometers with a permanent magnet but is also of value in connection with large electromagnet types. In accordance with a further aspect of the invention, an existing spectrometer may be enhanced and its operation ability considerably improved fitting an NMR probe at a suitable position and using the already existing outputs and magnet controls in conjunction with a microprocessor programmed to operate as set out above.

The amount of power which is needed to adjust the magnetic field may be relatively small in preferred embodiments, since the bulk of the field is provided using permanent magnetic materials. Power is then only dissipated in achieving the desired field value. The minor correction required to the magnetic field to keep the g-value constant is easily achieved using coils wound in or round the pole pieces of the permanent magnet, which do not require large amounts of power and therefore do not dissipate much heat. This is in contrast to classical ESR spectrometers with large electromagnets usually needing three phase electrical supplies and water-cooling.

Advantageously, the control means includes a dedicated microprocessor which receives signals corresponding to microwave frequency and magnetic field strength and calculates the fixed relationship, deviation of the fixed relationship from the demand g-value causing the magnetic field strength to be corrected. Advantageously this control is not limited to keeping one demand value, but can provide a calibrated sweep across a range of g-values requested.

The means for applying the magnetic field may comprise a permanent magnet arranged around the sample cavity, and means may be provided for modulating the local magnetic field applied to the sample, the permanent magnet including sweep coils wound round its pole pieces which are energised to adjust the magnetic field strength. Preferably, the means for modulating the local magnetic field comprises coils incorporated into the walls of the sample cavity.

The means for detecting electron spin resonance or cavity changes preferably comprises a microstripline microwave circuit incorporating a superheterodyne detector and phase sensitive receiver for monitoring and detecting modulation of the microwave signal reflected back from the cavity.

The use of microstripline technology facilitates the miniaturisation and thus improves the portability of the spectrometer, whilst retaining all the features and sophistication of the instrument. Fully automatic control can be implemented without comprising the types of samples that can be investigated.

The control means may include a local oscillator which produces a fixed local oscillator signal which is mixed with the microwave frequency to produce an intermediate frequency, the microwave frequency being measured indirectly by processing the intermediate frequency signals.

Preferably the spectrometer includes means effecting automatic adjustment of sample cavity critical coupling including a reverse power detector, means for supplying data from such detector to a control microprocessor, the microprocessor including a control algorithm enabling a control signal to be produced, and a stepper motor controlled by the control signal and having its output shaft coupled to the control member of a tunable iris.

For a better understanding of the invention, reference will now be made, by way of example only, to the accompanying drawings in which.

Figure 1:
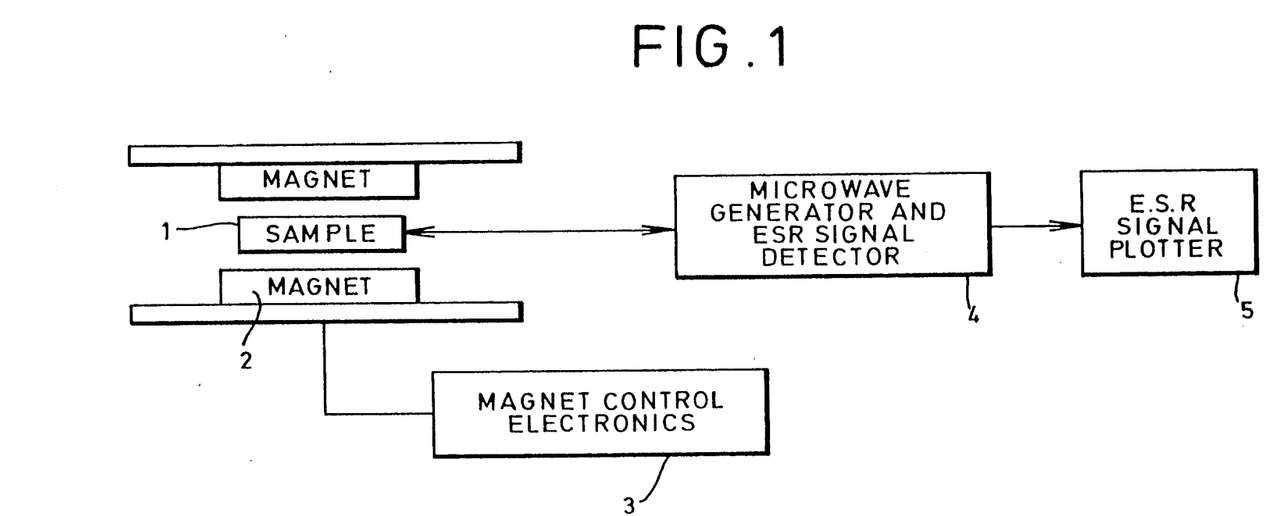
FIG. 1 is a block diagram of a basic electron spin resonance spectrometer.

Referring initially to FIG. 1, a block diagram of a basic electron spin resonance (ESR) spectrometer is illustrated. The spectrometer comprises a sample cavity 1 placed in magnetic field which is provided by a magnet 2. The magnet 2 is controlled by a variable power supply 3. A microwave generator and ESR detector 4 supplies microwave energy to the sample cavity 1 and provides an output signal to an ESR signal plotter 5 or computer.

In operation, a test sample is placed in the sample cavity 1 and the magnet 2 is energised to align free radicals present in the sample. Microwave energy is supplied to the test sample and the free radical resonance condition of the sample is monitored. The generator/detector 4 supplies the microwaves to the cavity and monitors the cavity for resonance.

In an ESR spectrometer shown in FIG. 1, the magnetic field strength has to be adjusted in relation to the microwave frequency to maintain a constant g-value which is necessary for resonance to occur. As mentioned previously, field/frequency locking devices can be used to maintain a constant g-value, that is the quotient f/H where f is the microwave frequency and H is the magnetic field strength. However because of the arrangement necessary to effect field/frequency locking without disruption of the magnetic field, prior art ESR spectrometers having such devices are bulky.

Figure 2:
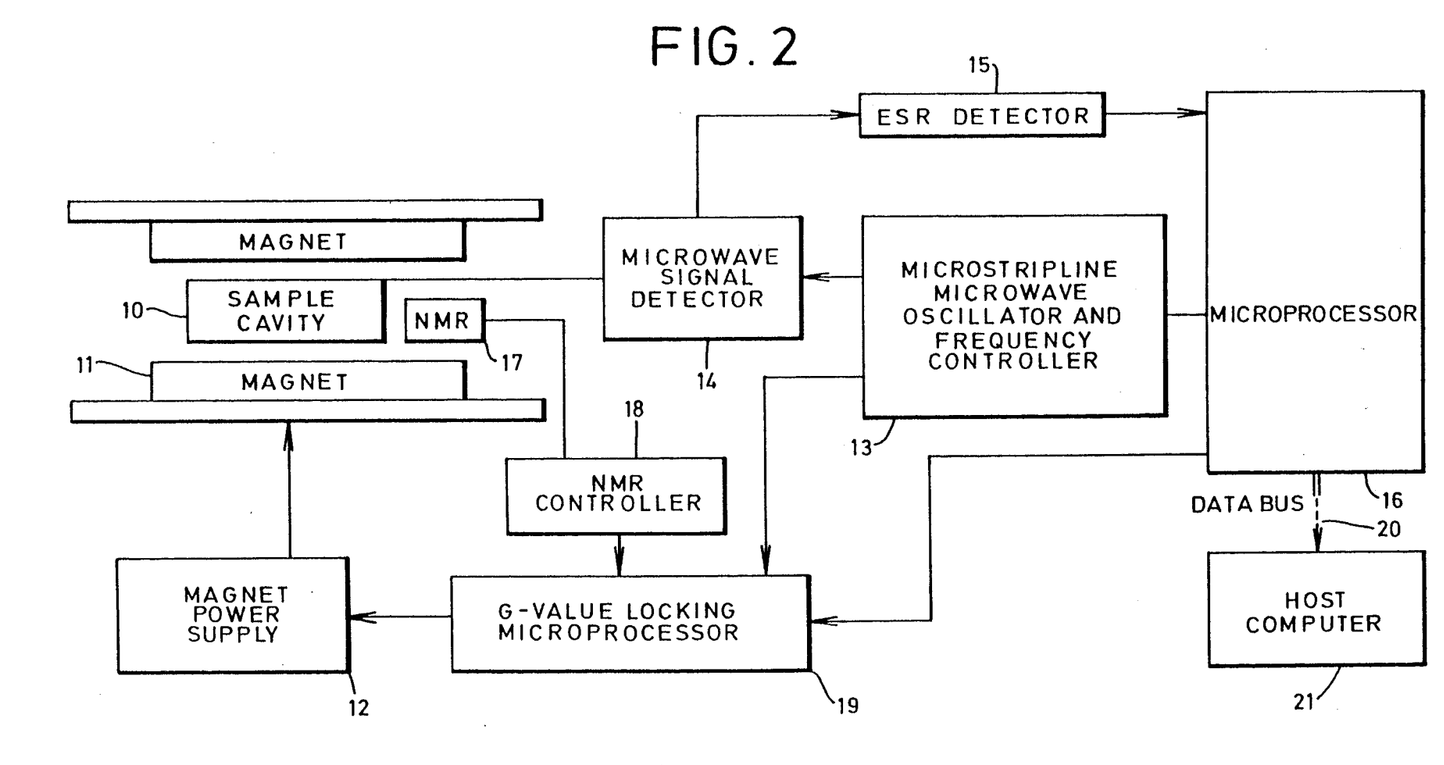
FIG. 2 is a block diagram of an electron spin resonance spectrometer according to the invention.

FIG. 2 illustrates an ESR spectrometer according to the present invention. The spectrometer comprises a sample cavity 10 which lies between the pole pieces of a hybrid magnet 11. The hybrid magnet 11 comprises a permanent magnet which incorporates sweep coils (not shown). The sweep coils are energised by power supply 12. A microwave oscillator and frequency controller 13 supplies microwave energy to the cavity 10 and locks the microwave oscillator frequency to that of the sample cavity, and a detector 14 monitors the microwave energy reflected from the cavity 10. An ESR detector 15 receives signals from the detector 14 and then passes signals to a microprocessor 16 at resonance. A nuclear magnetic resonance (NMR) probe 17 is positioned close to the sample cavity 10 and is used to monitor the magnetic field and is controlled by a controller 18. A dedicated microprocessor 19 receives signals from the microwave oscillator frequency controller 13 and the NMR controller 18 and produces signals for the control of the power supply 12 in accordance with the demand value from microprocessor 16. The microprocessor 16 may be connected by means of a data bus 20 to an external host computer 21.

The spectrometer of the invention operates in a similar way to that described with reference to FIG. 1. However, it is controlled by microprocessor 16. The sample cavity 10 lies in a magnetic field which is produced by the hybrid magnet 11. A test sample placed in the sample cavity 10 has its free radicals aligned with the magnetic field. A major part of the magnetic field is produced by the permanent magnet, the field strength being finally adjusted by passing electric current from the power supply 12 through the sweep coils. Microwave energy generated by the microwave oscillator frequency controller 13 is fed to the sample cavity 10 by co-axial cable (not shown). The NMR probe 17 measures the magnetic field produced by the magnet 2. Protons in the NMR standard inside the probe 17 undergo nuclear magnetic resonance at a frequency close to 14 MHz for the magnetic field strengths normally used in ESR. The NMR frequency is directly proportional to the magnetic field strength and using digital processing techniques circuitry can be used to count the NMR frequency directly to give a measure of the field strength. This method of measuring the magnetic field local to the sample cavity 10 does not disturb the field in a way that interferes with electron spin resonance and allows a miniaturised magnet design to be implemented.

As mentioned above, $$g = k(f/H)$$

where g is the g-value corresponding to free radical resonance condition. It can be seen that if the frequency, f, varies, the magnetic field strength, H, must be adjusted to maintain a precisely defined g-value, fixed or swept across a spectrum depending on the investigation being carried out. The dedicated microprocessor 19 receives signals corresponding to the magnetic field strength H (using NMR probe 17 and its controller 18) and the microwave frequency, f, (from oscillator frequency controller 13) and determines the g-value. Any change in the g-value from a demand value corresponding to the free radicals whose presence is being determined, causes the power supply 12 to energise the sweep coils of the magnet 11 in order to adjust the magnetic field strength accordingly. The adjustment is set, by the program in microprocessor 19, to maintain a constant g-value.

In some applications where the shape of the resonance spectrum is to be investigated or where an unknown free radical having an unknown g-value is to be detected, it is necessary to scan the g-value, dependent on the relationship between the applied magnetic field and the microwave frequency, over a precise and accurate range. By providing a series of incrementing or decrementing demand values to the microprocessor 19, the relationship between the magnetic field and the microwave frequency can be precisely and accurately scanned over a defined range of g-values. Whereas existing methods allow the relationship between the magnetic field and the microwave frequency to be precisely offset from the resonance condition of an ESR standard, these have the disadvantages that they can generate magnetic field scans of only about 0.01 Tesla, and are increasingly inaccurate for increasing offsets and create perturbations to the applied magnetic field that increase with increasing offsets. The spectrometer of the present invention has no such scan limitations, is equally accurate for all demand g-values and does not perturb ESR determinations at any g-value.

A spectrometer according to the present invention can thus be operated over a wide range of accessible g-values. It also has the advantage that it can be instructed directly to set up the appropriate conditions for observing a free radical of interest without the need for the operator to consider the actual magnetic field or microwave frequency settings, this being taken care of by the program in microprocessor 19. This provides a spectrometer which is set by the g-value alone and this makes the spectrometer easy to use for non-specialists.

While there is no requirement to know the actual magnetic field and microwave frequency in most cases, these parameters may be of interest in some research applications. Since the instrument measures them directly as part of its normal function, they are made accessible to the host computer system 21, and can be output to a printer, plotter or other display as desired.

Conventional ESR instruments employ large electromagnets to produce a homogeneous magnetic field which can be varied to compensate for changes in microwave frequency. Such electromagnets may weight up to 5 tonnes, consume several kilowatts of electrical power, and require water cooling. The magnet 11 used in the spectrometer of FIGS. 2 to 8 is preferably a rare earth permanent magnet. By way of example, the magnet may be in the form of a cylinder 135 mm long with a diameter of 275 mm, and weigh less than 25 kg. Sweep coils are wound within the magnet to enable the magnetic field strength to be adjusted. Since such correction is normally only of the order of hundredths of a Tesla, the associated power supply 12 does not need to be very powerful.

Figure 3:
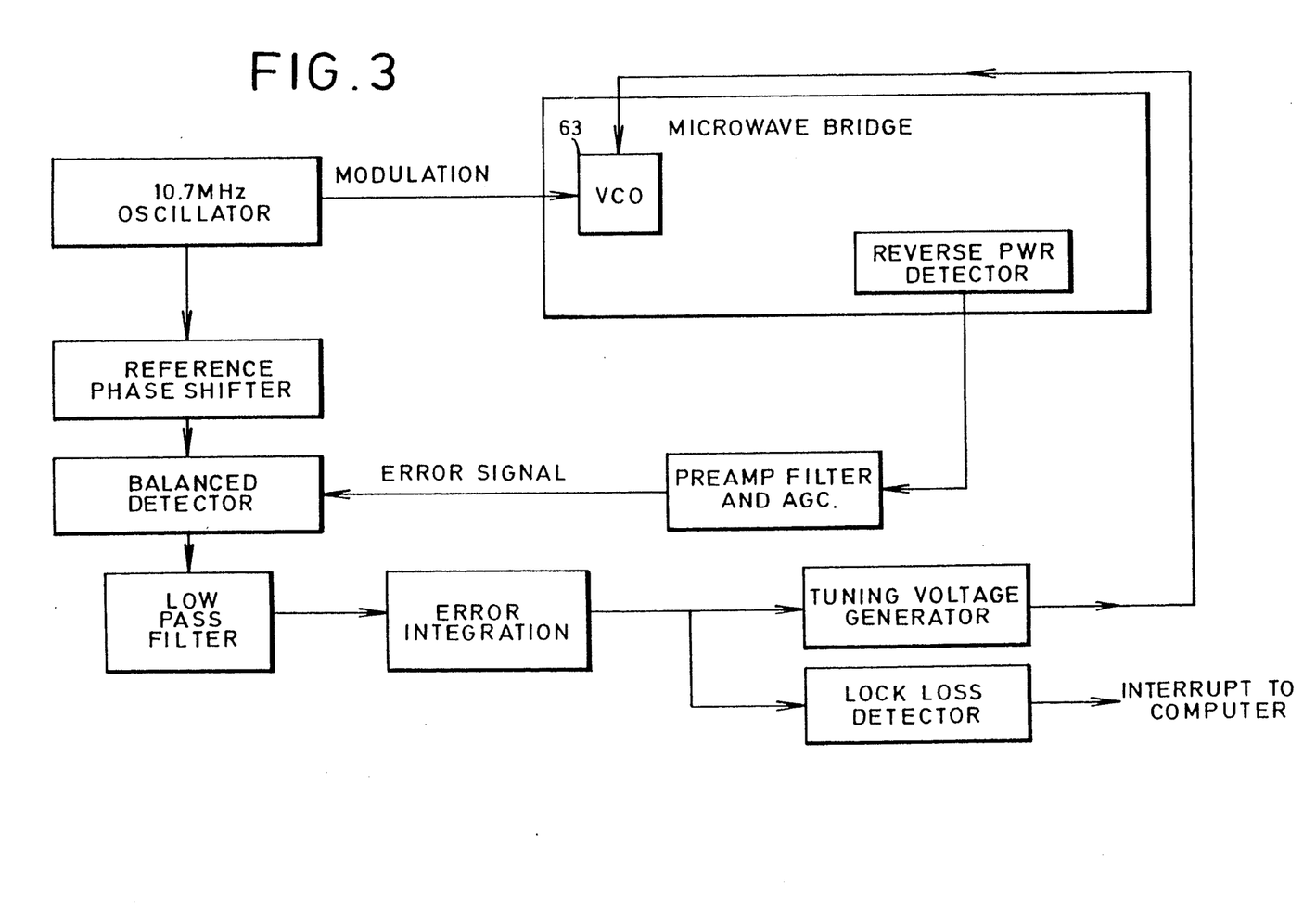
FIG. 3 is a block diagram of a microwave oscillator frequency controller used in the spectrometer of FIG. 2.

FIG. 3 illustrates a block diagram of the microwave oscillator frequency controller 13. This device ensures that the frequency of oscillation corresponds to that of the resonant sample cavity 10. This is very important as maximum system sensitivity will only occur when these exactly coincide with each other. This is known as frequency locking, and is particularly important when changing samples frequently as the cavity frequency changes with the type of sample.

The microwave oscillator frequency controller 13 operates by frequency modulating the microwave oscillator with a reference signal (in this case a frequency of 10.7 MHz is chosen because it is very much higher than any other modulation product used within the spectrometer, and will therefore not interfere with or suffer interference from any other signal). If the frequency of the voltage controlled oscillator 63 becomes offset from the cavity frequency due to thermal drift or change of sample etc, then due to the response of the cavity 10, any reflected microwave power becomes amplitude modulated with the same frequency as the frequency modulation (10.7 MHz). This amplitude modulation will either be in phase or out of phase with the reference signal when the frequency is too high or too low respectively. By demodulating the reflected microwave power and phase detecting it, an error signal can be produced which when integrated will form an automatic frequency control for the microwave oscillator.

This control loop is essentially self-contained and requires no intervention from the microprocessor 16 once a frequency lock has been found. This is explained in more detail below with reference to FIG. 7.

The method of magnetic field control is very sophisticated and it takes account of variations not only in microwave frequency but also those due to temperature effects in the permanent magnet. This allows the spectrometer to look at a specific spectral line without having to go through normal search processes associated with conventional spectrometers or to sweep a well defined range.

Figure 4:
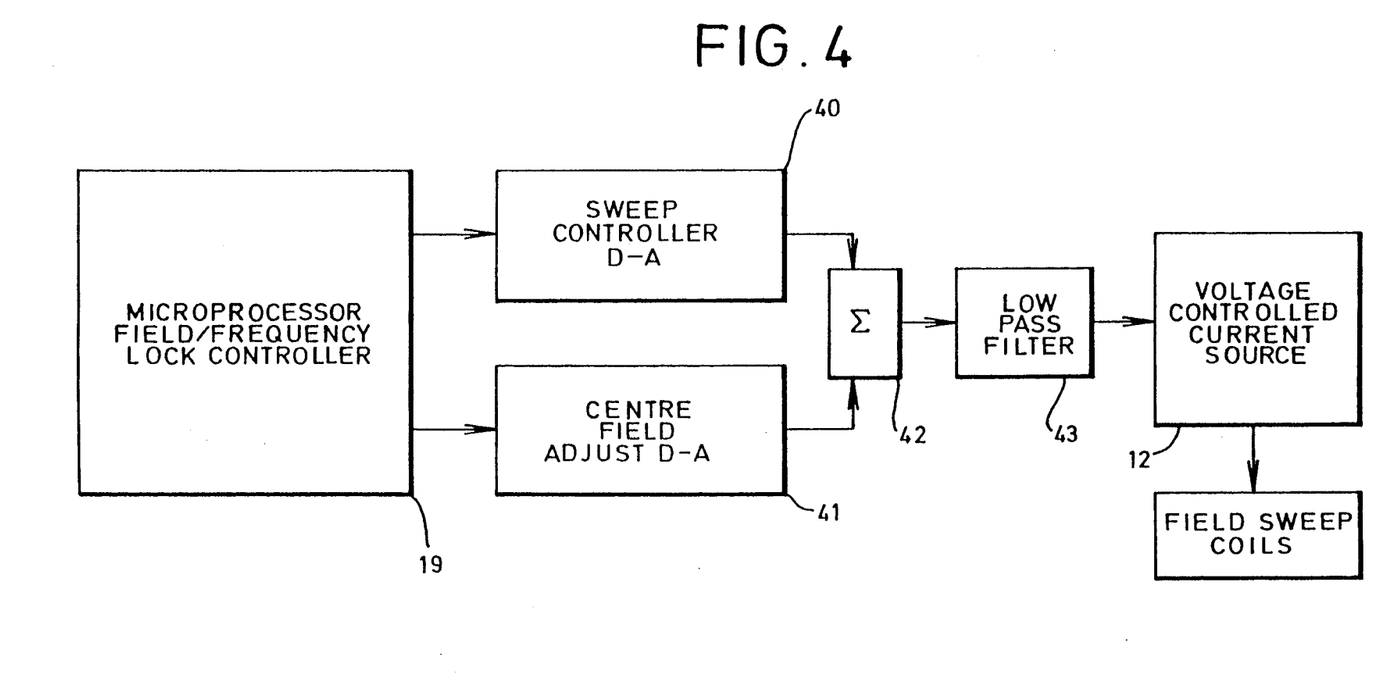
FIG. 4 is a block diagram of a magnetic field controller used in the spectrometer of FIG. 2.

FIG. 4 illustrates a block diagram of the magnetic field controller and power supply. The magnetic field strength is controlled by the variable current source or power supply 12 which is connected to the sweep coils wound round the pole pieces of the magnet 11. The control of the current source is provided by the dedicated processor 19 by way of two digital to analogue converters 40, 41. The dedicated processor 19 takes the information regarding the current value of the magnetic field strength and the microwave frequency and computes the current g-value. This value is then compared with the demand value and any correction implemented. Digital to analogue converter 41 sets the approximate centre value for the field and digital to analogue converter 40 provides the main control for fine tuning and any sweep required. The control voltages produced by the digital to analogue converters 40, 41 are combined in a weighted summing circuit 42 and then passed through a low pass filter 43 to prevent any sudden transients from reaching the magnetic sweep coils causing large transient changes.

Figure 5:
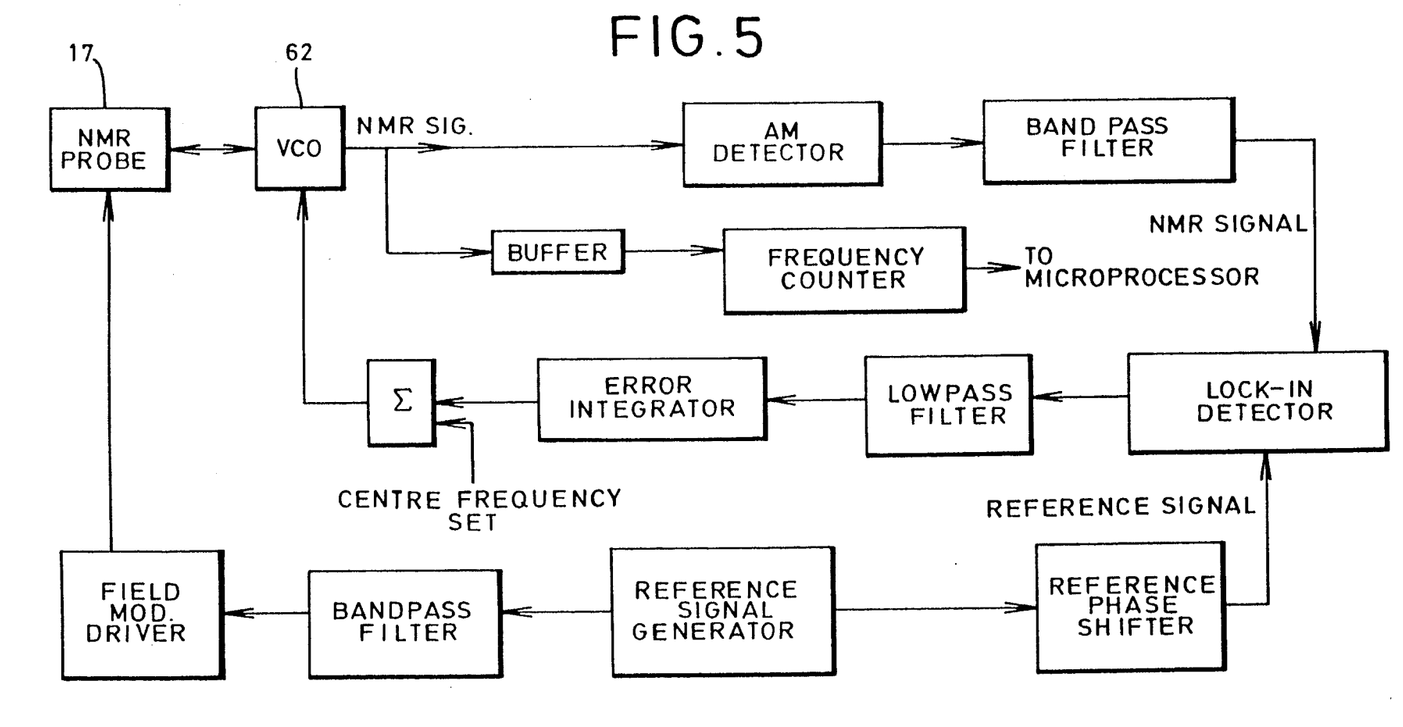
FIG. 5 is a block diagram of a nuclear magnetic resonance probe used in the spectrometer of FIG. 2.

FIG. 5 is a block diagram illustrating the NMR probe 17 and its controlling circuitry 18. This method of measuring the magnetic field is substantially independent of temperature and is essentially one of frequency counting which can be accurately accomplished and interfaced with the processor 19. The resonance once found will be locked onto using an electronic control loop so that the frequency measured will always correspond to the magnetic strength at that time. The method of achieving this is to look at the differential NMR signal by modulating the magnetic field in the region of the reference sample with a reference signal. Small pancake coils are (not shown) incorporated around the NMR probe 17 and modulate the local magnetic field applied to the sample at 1 kHz. This magnetic modulation causes the sample to be driven in and out of magnetic resonance at 10 kHz when the NMR standard is very close to the resonant condition. The resulting NMR signal will then be sinusoidal with the same frequency and a phase that relates to whether the probe frequency is a little too high or a little too low. By phase detecting this signal an automatic frequency control voltage can be generated to control the voltage controlled oscillator 62. The frequency of oscillator 62 can then be counted and used by the dedicated microprocessor 19 to calculate the magnetic field and g-value.

Figure 6:
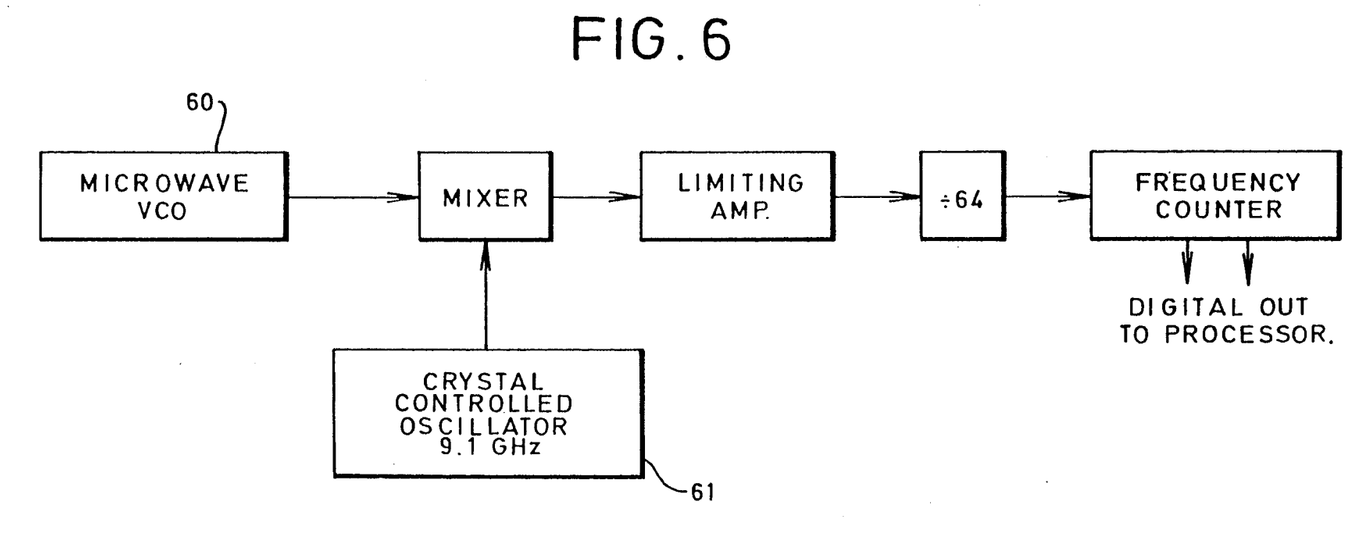
FIG. 6 is a block diagram of a microwave frequency measurement circuit as used in the spectrometer of FIG. 2.

There may be certain advantages in controlling the g-value by means of measuring the microwave frequency and calculating the required NMR frequency to give resonance of the NMR standard at the correct magnetic field for the demand g-value. The NMR frequency would preferably be synthesized using a phase locked loop under computer control, and the magnetic field varied to maintain the NMR sample under resonance. In such a system the field/frequency locking could be maintained over a wide range of g-values or sweeps. FIG. 6 illustrates a block diagram of a microwave frequency measuring circuit. A microwave oscillator 60 has a variable frequency which is dependent on sample types. The microwave oscillator frequency is in the range of 8.5 to 9.0 GHz giving an ESR frequency range of 9.0 to 9.5 GHz. and local oscillator frequency range of 8.0 to 8.5 GHz when balanced modulated. The 8.5 to 9.0 GHz signal is mixed with a 9.1 GHz reference signal from a crystal controlled oscillator 61, an intermediate frequency in the range of 100 to 600 MHz is obtained. This frequency is then divided by a factor of 64 to allow standard logic devices to be used in the frequency counter. The counter output then goes to the processor 19 so that the g-value can be calculated and corrected if necessary.

This method of measuring the microwave frequency is preferred as it avoids the expense of directly measuring it using a frequency counter. Additionally, by mixing the microwave frequency with a known reference to give an intermediate frequency, all the resolution (which would be lost if frequency division techniques were employed) is retained.

Figure 7:
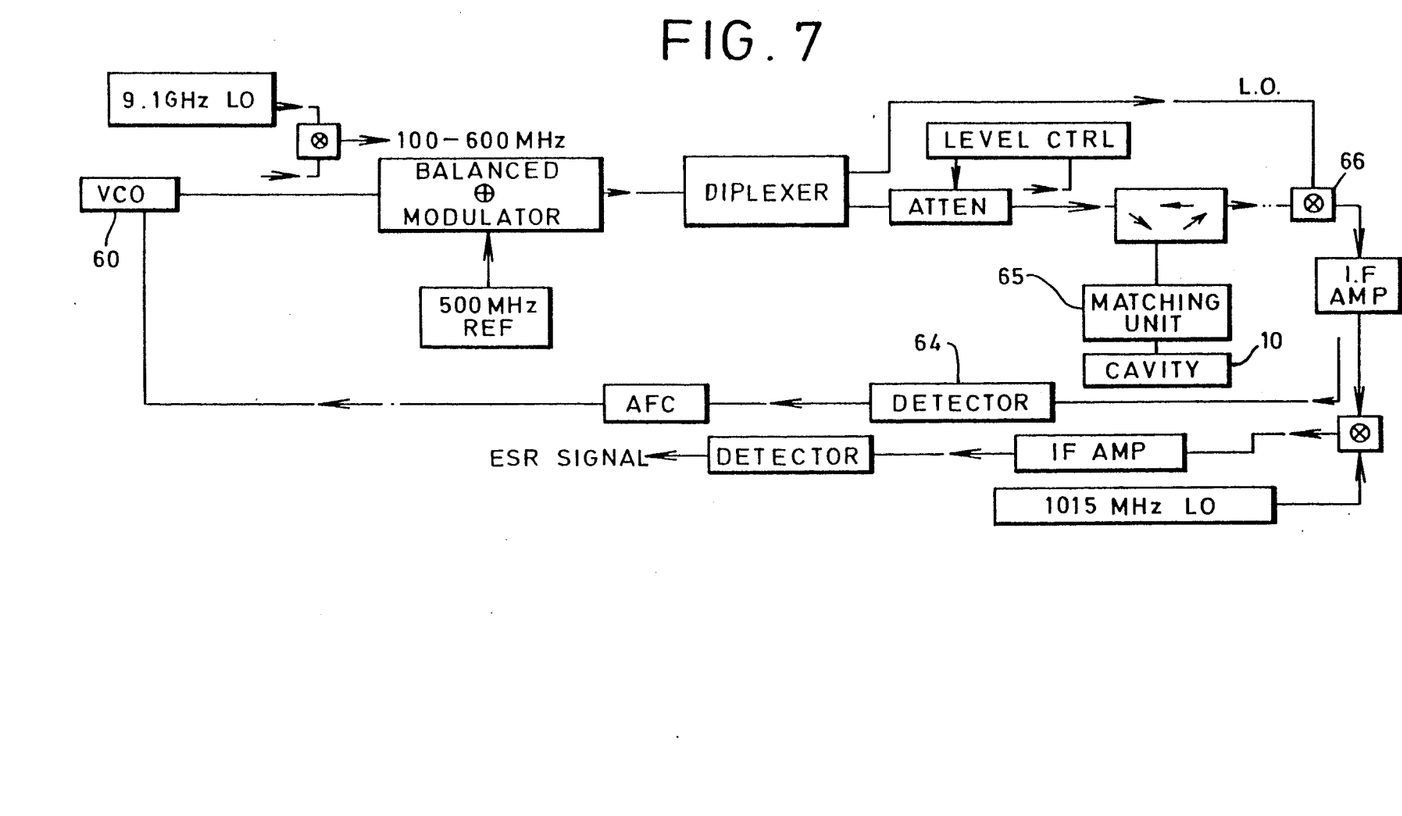
FIG. 7 is a block diagram of a microstrip line bridge design for a spectrometer as shown in FIG. 2.

When using the spectrometer for testing biological materials, the microwave power must be variable down to levels of 100 microwatts as some samples may saturate easily. The power level is electronically controllable using a variable attenuator with a power level sensing circuit as a feedback controller. This is achieved by the use of an electronically controllable circuit (which is shown in FIG. 7) using PIN diodes which act as current controlled resistors at microwave frequencies. A non phase sensitive detector 64 detects the power reflected from the sample cavity 10, in order to allow reliable frequency locking and indication of the quality of the match to the cavity 10. The matching may be adjusted using e.g. a stepper motor under microprocessor control to screw a coupling adjustment screw 65 (see FIG. 8) in or out. A mixer is included for the microwave frequency measurement as discussed above. The main ESR detector 66 is of a dual conversion superheterodyne design with 1 GHz and 15 MHz intermediate frequencies. The method of producing the first local oscillator and ESR signals of exactly 1 GHz offset is by means of a balanced modulation of the microwave GaAs FET voltage controlled oscillator by a 500 MHz reference signal producing two sidebands at 1 GHz offset from each other and a suppressed carrier. The two sidebands are separated using a diplex filter built in microstripline to give two separate outputs. The lower sideband is taken as the local oscillator and the upper sideband the ESR signal. The use of a 1 GHz IF gives better performance of the mixer, keeps the signal well away from any noise components on the carrier and allows low noise amplification at the IF frequency, reducing the noise of the total system. The 1 GHZ IF signal is then mixed again with a signal of 15 MHz offset (1015 MHz rather than 985 MHz to keep image frequency out of the passband of the 1 GHz amplifier) to give a second IF of 15 MHz. The signal is amplified, then the amplitude modulation due to esr is demodulated, before being coherently detected.

Microstrip technology is preferably used to implement the spectrometer of the microwave circuit to be reduced to approximately 100 mm×70 mm in size, excluding the sample cavity 10.

In place of the superheterodyne detector described above, it is possible to use a balanced detector though this is less preferred. The problem of using a balanced detector at the frequencies in question is that it tends to be fairly phase critical and if the path lengths are not accurately the same, difficulties can arise, albeit that the operating software for the unit may be able to compensate for them. Although superheterodyne detection is more expensive in terms of the manufacture of the circuit, it does not give rise to such problems. Microstripline phase shifters are difficult to make and are not a viable alternative.

During ESR analysis, a test sample is placed in a resonant cavity for two main reasons. The first reason is that within a cavity the magnetic and electric fields are very well defined, and secondly, due to superposition theory the effective microwave signal power is increased giving greater sensitivity. The sample must be placed exactly in the magnetic field maximum for optimum sensitivity.

Figure 8:
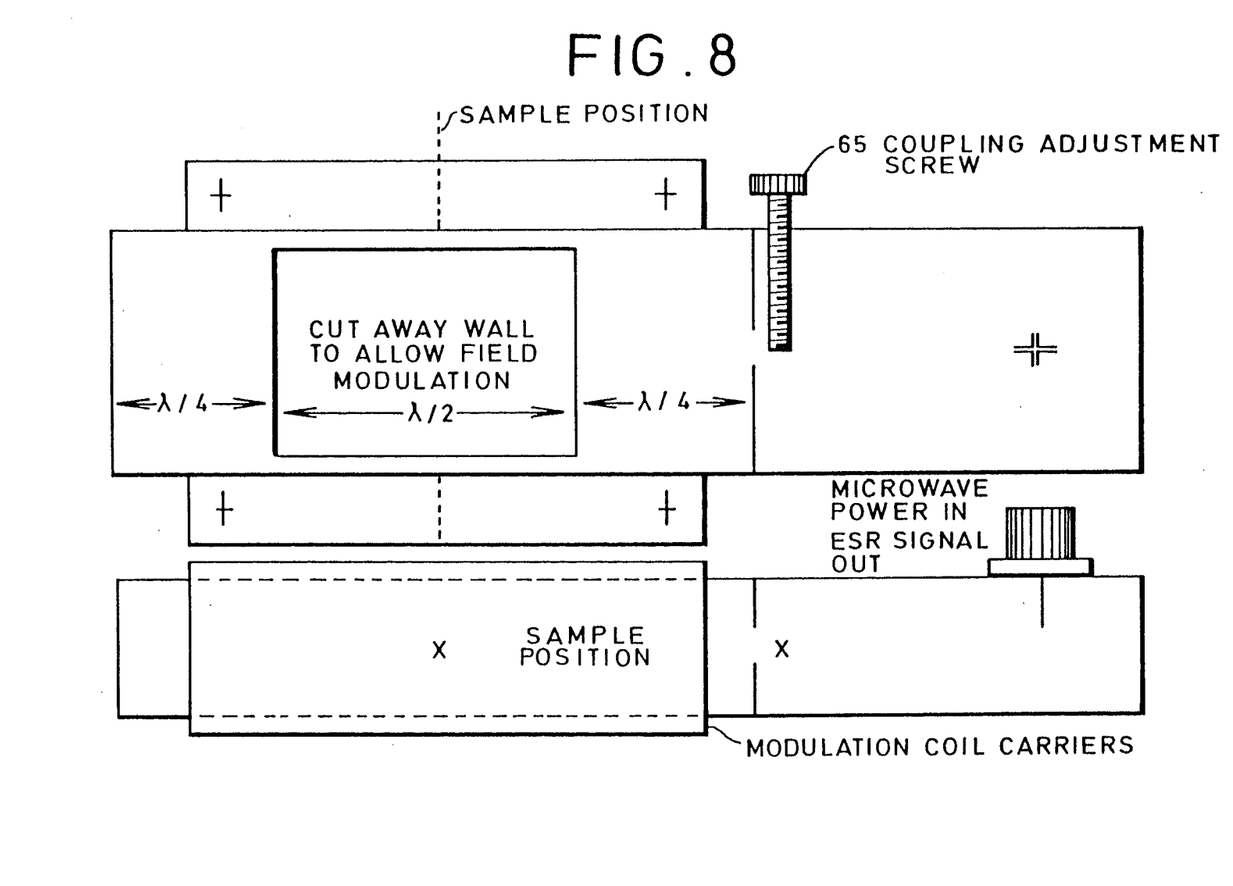
FIG. 8 is a block diagram of a sample cavity for the spectrometer of FIG. 2.

In the spectrometer of the present invention, the cavity is preferably rectangular, both for ease of construction and also on cost grounds. A preferred construction of sample cavity is shown in FIG. 8. The cavity is constructed from a length of standard microwave waveguide with the central parts of the side walls removed and replaced by silver foil. The foil is of thickness less than the characteristic "skin depth" at the magnetic field modulation frequency (i.e. 100 kHz), so that the modulation signal penetrates with little loss. The microwave power is coupled into the cavity through a small circular iris which is tunable to enable critical coupling to occur over the entire frequency range. The iris is tunable under computer control by the use of a stepper motor to screw the coupling adjustment screw 65 in and out. The reflected power is monitored by detector 64 in the microstripline bridge, and when this is at a minimum the coupling is critical. The cavity may be connected to the rest of the microwave bridge by a length of rigid co-axial cable.

The cavity is a TE102 mode cavity which gives a magnetic field maximum down the centre of the cavity coupled with an electric field minimum. This gives maximum sensitivity to the magnetic properties and keeps the perturbations due to any loss in the sample down to a minimum. The cavity is designed to have a resonant frequency of 9.5 GHz when there is no sample present. This reduces when a sample is inserted and can be as low as 9.01 GHz if the sample is located in a dewar for low temperature work.

Metal fittings may be provided to hold sample holders in optimum position for study in the microwave cavity. Various types of sample holders may be used, e.g. containing single solid or liquid samples, or samples in liquid nitrogen, or a sample holder may be used which enables liquid samples to flow through the instrument continuously. Quartz-glass flow-through cells may be used for continuous liquid samples. These cells may be simple cells for monitoring liquids directly, or complex ones for rapidly flow-mixing reagents in the microwave cavity for observing fast reaction kinetics. The cells may contain electrodes to generate free radicals electrochemically as they enter the cavity. Free radicals can also be generated within the sample in the microwave cavity by shining light through a grid-covered porthole in the cavity. The grid over the porthole renders the cavity permeable to light but impermeable to microwaves. The cavity may be provided with fittings and vents so as to allow gas to be passed through in order to eliminate condensation from the cavity or to allow the temperature of the cavity or of the sample to be controlled.

Figure 9:
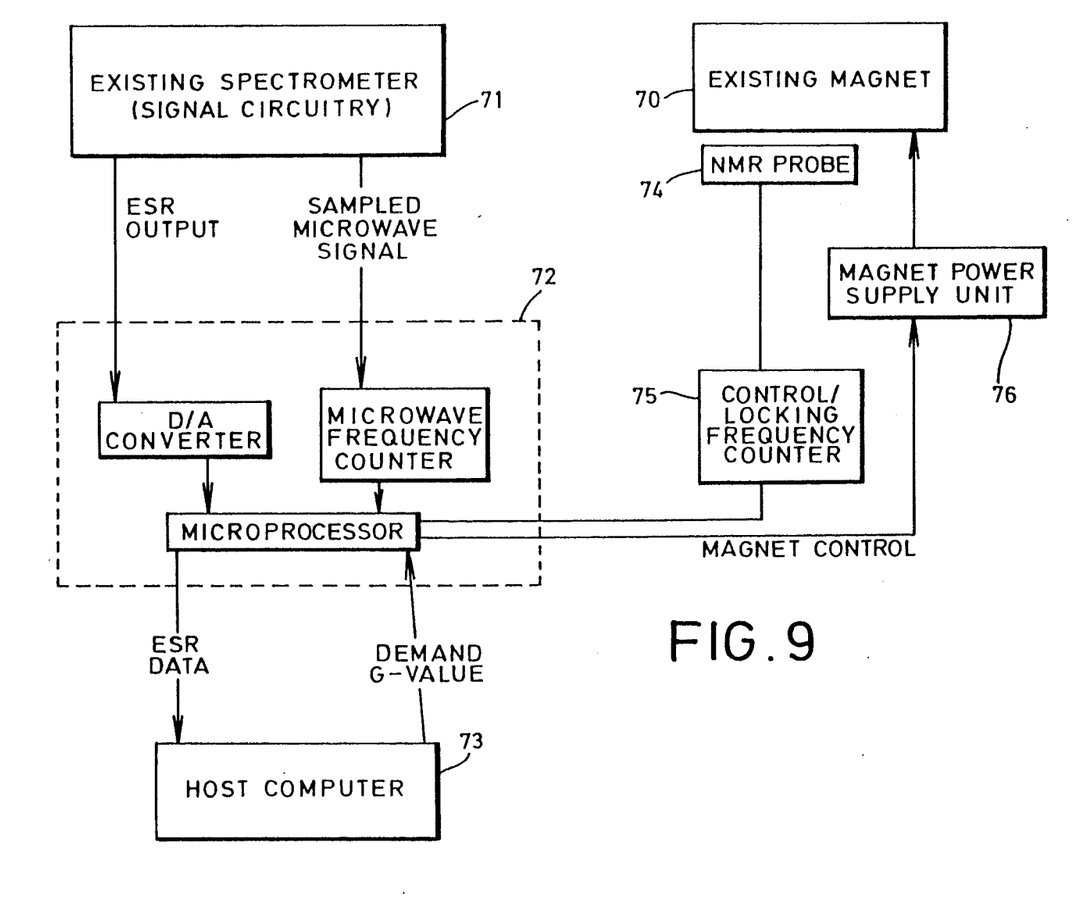
FIG. 9 is a block diagram showing a pair of modified ESR spectrometers to operate in accordance with the invention.

Turning now to FIG. 9, as noted above, it is possible to obtain substantial benefits from the present invention not only in the design and operation of a compact ESR spectrometer as described with specific reference to FIGS. 2 to 8, but also by converting existing ESR spectrometers. FIG. 9 shows schematically how this may be done with a conventional large scale electromagnet operated ESR spectrometer.

Any such spectrometer has standard ESR signal and microwave signal sample outputs and these are schematically illustrated at 71 in FIG. 9. In addition, shown separately for ease of explanation, the existing spectrometer has an existing magnet 70 usually a very large heavy three-phase electromagnet and its associated power supply unit 76.

Such a spectrometer may be operated in accordance with the teachings of this invention by locating an NMR probe 74 at an appropriate position next to the pole piece of the existing magnet, providing its associated control and locking frequency counter 75 and providing circuitry analogous to that described above with reference to FIGS. 2 to 8 to control the magnet in accordance with signals from spectrometer. This is denoted by the three specific items boxed by dashed line box 72, the three items being a digital to analogue converter, a microwave frequency counter and a microprocessor. These all work in fashion analogous to the system operating using a permanent magnet as explained above, and likewise the microprocessor may be conditioned to operate appropriately by feeding it a demand g-value from host computer 73, which may also be used to store and/or display ESR data as desired.

There are three types of software required for the operation of the ESR spectrometer according to the present invention: one for the g-value controller microprocessor 19, one for the system interface microprocessor 16 and for the host computer system 21. The microprocessor 19 that controls the g-value of the instrument has an algorithm that accepts 19 bits of data from the microwave frequency counter, calculates the corresponding g-value, compares this to demand values provided by the system interface microprocessor 16 and generates a 14 bit output to a digital to analog converter that adjusts the magnetic field power supply unit. This algorithm may be contained in read only memory (ROM). The system interface microprocessor may also have ROM-based firmware to control all aspects of the instrument other than the g-value locking and to interface the instrument to the host computer. When the instrument is first turned on, or when the sample is changed, it may be programmed to adjust the stepper motor on the iris coupling to the cavity in order to provide critical coupling. In conventional ESR spectrometers, this is a manual adjustment. In addition, it is preferably arranged to configure the instrument to the parameters requested by the host computer. This may include setting the microwave power level, 100 kHz modulation level, and passing a required g-value to the g-value controller 19. During data acquisition, the interface computer preferably automatically sets the ESR receiver gain to the optimum level, calculates the next g-value to be investigated if a spectral scan is required and updates the g-value controller and acquires the digitised ESR intensity from the receiver and sends it to the host computer 21. The firmware packages for the g-value microprocessor 19 and interface microprocessor 16 are preferably written in assembly language and contained as firmware in ROMs within the ESR instrument.

The host computer preferably runs a software package written in a high-level language, enabling it to be easily configured to the specific needs of the user and to be user-friendly. The program may send set-up information to the interface microprocessor in the ESR instrument to configure it for the required measurements and then receives ESR data as it is relayed back. It is also preferably programmed to alert the user to any error conditions. The program may also analyse the data and present it to the user in numerical or graphical form, or, in automated applications, generate feedback data or alarm signals. Various data processing packages may be used.

The host computer can be a personal computer installed near to the spectrometer or it can be a remote computer. In the latter case, the spectrometer can be used in an industrial plant or a patient monitoring environment.

I claim:

1. An electron spin resonance spectrometer for measuring free-radical resonance of a material comprising:
   (1) a material-receiving cavity positioned between poles of a permanent magnet;
   (2) means for applying microwave energy having a frequency to the cavity;
   (3) electromagnetic means for measuring the frequency of the microwave energy applied to the cavity and which in conjunction with the permanent magnet provides a magnetic field of variable strength to the cavity;

(4) means for adjusting the strength of the magnetic field in the cavity;

(5) means for detecting changes in the microwave energy which is reflected from the cavity;

(6) means for analyzing the changes detected in the microwave energy reflected from the cavity;

(7) a sample-receiving reference cell positioned between the poles of the permanent magnet and parallel to the material-receiving cavity;

(8) means for measuring a nuclear magnetic resonance frequency of a sample present in the reference cell;

(9) means for calculating from the nuclear magnetic resonance frequency measured the magnetic field to be provided by the permanent magnet to the cavity and the reference cell; and (10) means for applying the magnetic field as calculated by the means for calculating the magnetic field to control the strength of the magnetic field provided by the permanent magnet.

2. A spectrometer as claimed in claim 1 further comprising a dedicated microprocessor adapted to (1) receive signals corresponding to the frequency of the microwave energy and the strength of the magnetic field, (2) calculate a g-value of the material received in the cavity, and (3) adjust the strength of the magnetic field provided by the permanent magnet of compensate for any deviation between the g-value as calculated and a predetermined g-value.

3. A spectrometer as claimed in claim 2 further comprising sweep coils in conjunction with the poles of the permanent magnet and means for selectively energizing the sweep coils to adjust the strength of the magnetic field provided by the permanent magnet.

4. A spectrometer as claimed in claim 3 wherein the means for detecting changes in the microwave energy reflected from the cavity includes a microstripline microwave circuit incorporating a superheterodyne detector and a phase-sensitive receiver for monitoring and detecting modulation of the microwave energy reflected.

5. A spectrometer as claimed in claim 4 wherein the means electromagnetic for measuring the frequency of the microwave energy includes a local oscillator producing a fixed output, means for mixing the fixed output with the frequency of the microwave energy applied to produce an intermediate frequency, and means for measuring the frequency of the intermediate frequency.

6. A spectrometer as claimed in claim 5 further comprising means for effecting automatic adjustment of the frequency of the microwave energy applied to the cavity which includes a reverse power detector; means for supplying an output signal from the means for detecting changes in the microwave energy to a microprocessor wherein the microprocessor includes a control algorithm producing an output signal and a stepper motor controller by the output signal and having an output shaft coupled to a control member of a tunable iris.

7. A method of operating an electron spin resonance spectrometer comprising:

(1) locating a cavity between poles of a permanent magnet;

(2) applying microwave energy having a frequency to the cavity;

(3) locating a microwave signal which is reflected back from the cavity;

(4) mixing the microwave signal with an output signal of a local oscillator to generate a signal at an intermediate frequency;

(5) controlling the strength of the magnetic field in the cavity, thereby providing a magnetic field of variable strength, by applying an additional electromagnetic field to the cavity in accordance with the frequency of the signal at an intermediate frequency;

(6) continuously measuring the strength of the magnetic field in the cavity, and (7) varying the strength of the magnetic field by use of a programmed microprocessor to maintain a constant relationship between the strength of the magnetic field and the cavity's resonance frequency.

* * * * *